(12) United States Patent
Caesar

(10) Patent No.: US 8,290,169 B1
(45) Date of Patent: Oct. 16, 2012

(54) TIME SHIFTED HARMONICS GENERATOR

(75) Inventor: Marvin W. Caesar, Sherman Oaks, CA (US)

(73) Assignee: Aphex LLC, Sun Valley, CA (US)

( * ) Notice: Subject to any disclaimer, the term of this patent is extended or adjusted under 35 U.S.C. 154(b) by 455 days.

(21) Appl. No.: 12/653,142

(22) Filed: Dec. 9, 2009

(51) Int. Cl.
*H03G 3/00* (2006.01)
*H04R 5/00* (2006.01)
*H03G 5/00* (2006.01)
*H04B 1/00* (2006.01)

(52) U.S. Cl. .................. 381/61; 381/62; 381/63; 381/1; 381/17; 381/19; 381/18; 381/119; 381/101; 381/107

(58) Field of Classification Search .............. 381/61–63, 381/1, 17–19, 101–109
See application file for complete search history.

(56) References Cited

U.S. PATENT DOCUMENTS

| 4,150,253 A | 4/1979 | Knoppel | |
|---|---|---|---|
| 5,424,488 A * | 6/1995 | Werrbach | 84/698 |
| 2005/0175185 A1 * | 8/2005 | Korner | 381/61 |

* cited by examiner

*Primary Examiner* — Devona Faulk
(74) *Attorney, Agent, or Firm* — Gordon & Jacobson, PC

(57) ABSTRACT

An electrical signal derived from an audio source is passed through an amplifier and is then divided into two discrete signal paths. The signal traveling along the first path travels through a high pass filter and is then split so that a portion is delayed and a portion passes through a harmonics generator so that the harmonics are advanced ahead of the delayed portion from the high pass filter. The split circuit is then combined in a summing amplifier. The second portion of the signal is also delayed before it also travels to the mixer. The combined signal is passed through an amplifier and then fed into an output transducer. The use of a delay both on the input signal and the portion of the signal which passed through the high pass filter output just before the summing amplifier enables the harmonics to not be masked by the lower frequencies, making the effect more apparent.

17 Claims, 2 Drawing Sheets

PRIOR ART

TIME SHIFTED HARMONICS GENERATOR

BACKGROUND OF THE INVENTION

1. Field of the Invention

The present invention relates to electronically processed sound to enhance the quality, clarity, presence, intelligibility and other characteristics of electronically processed sound.

2. Description of the Prior Art

In general, the concept of electronically processed sound to enhance the quality, clarity, presence, intelligibility and other characteristics of analog electronically processed sound is known. U.S. Pat. No. 4,150,253 to Knoppel addressees the concept. As set forth in FIG. 1 taken from this patent, the sound source 11 passes through an amplifier 13 and then divided into two discrete signal paths 15 and 17. The signal traveling along path 17 is passed in succession through an exciter circuit 19 and amplitude attenuator 21 and is then combined in a mixer 20 traveling along path 15. The combined signal is passed through an amplifier 23 and then fed into an output transducer 25 such as a loudspeaker. The exciter circuit includes high pass filter means and harmonics creator means. The harmonics creator means is designed to create harmonics based upon the amplitude of the signal through the high pass filter.

Another relevant patent in the prior art is U.S. Pat. No. 5,424,488 issued to Werrbach for Transient Discriminate Harmonics Generator which describes a means by which the harmonics are generated as transient discriminate.

A problem with the prior art references discussed above is that the harmonics are masked by the lower frequencies, thereby reducing the audibility of the effect. There is a significant need for an improved method and circuit to eliminate this problem.

SUMMARY OF THE INVENTION

The present invention is a method and apparatus for electronically processing sound. An electrical signal derived from an audio source such as a microphone, radio tuner, amplifier, etc. is passed through an amplifier and is then divided into two discrete signal paths. The signal traveling along the first path travels through a high pass filter and is then split so that a portion is delayed and a portion passes through a harmonics generator so that the harmonics are advanced ahead of the delayed portion from the high pass filter. The split circuit is then combined in a mixer or summing amplifier. The second portion of the signal is also delayed before it also travels to the mixer. All signals pass through their own attenuator before reaching the mixer. The combined signal is passed through an amplifier and then fed into an output transducer such as a loudspeaker. The harmonics generator is designed to create harmonics after frequencies are passed by the high pass filter means.

It has been discovered that the use of a delay on both the input signal and the portion of the signal which passed through the high pass filter output just before the summing amplifier enables the harmonics generated by the harmonics generator after the signal passed through the high pass filter to be advanced in time ahead of the input and high pass filter signals. As a result, the harmonics are not masked by the lower frequencies, making the effect more apparent. In addition, the peak level of the transient is increased less because the added harmonics are ahead in time of the transient that generated the harmonics.

Therefore, if the main input signal and the high pass signal are delayed and the generated harmonics are not delayed, there is an increase in the perceived effect of the harmonics. By allowing the harmonics to precede the other signals, they are not masked.

There are additional variations on the invention that could be added such as fixed and or dynamic level adjustments to the high pass signal before and/or after it is split to the harmonics generator and the summing amplifier. Also, the harmonics can be amplitude dependent, not just transient discriminate. The circuit can be used in a multi-band format as well as single band.

Further novel features and other objects of the present invention will become apparent from the following detailed description and discussion.

BRIEF DESCRIPTION OF THE DRAWINGS

Referring particularly to the drawings for the purpose of illustration only and not limitation, there is illustrated.

DETAILED DESCRIPTION OF THE PREFERRED EMBODIMENTS

Although specific embodiments of the present invention will now be described with reference to the drawings, it should be understood that such embodiments are by way of example only and merely illustrative of but a small number of the many possible specific embodiments which can represent applications of the principles of the present invention. Various changes and modifications obvious to one skilled in the art to which the present invention pertains are deemed to be within the spirit, scope and contemplation of the present invention.

Figure 1:
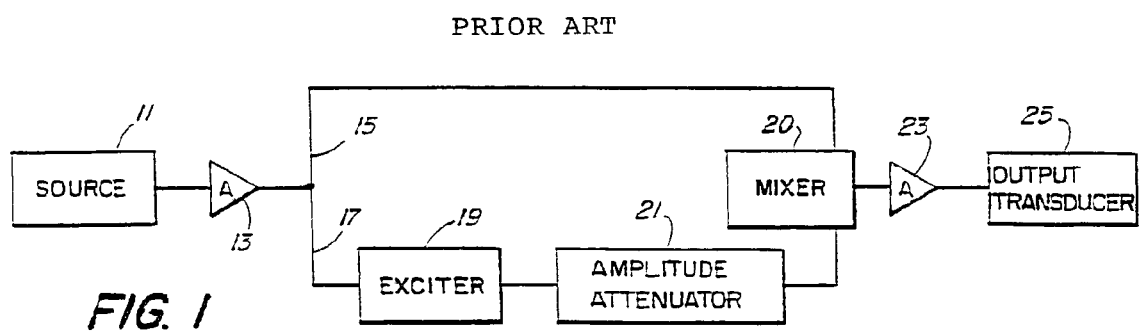
FIG. 1 is a block diagram of the prior art taken from U.S. Pat. No. 4,150,253.
Figure 2:
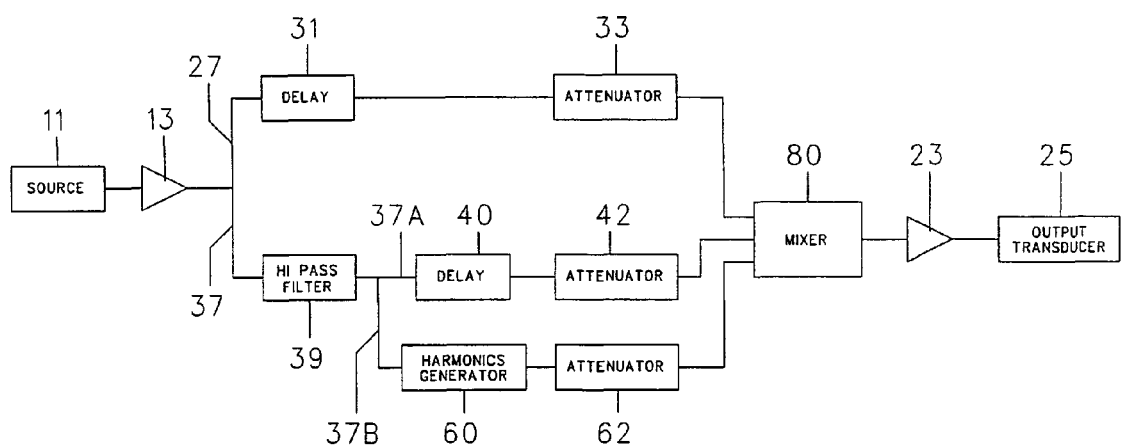
FIG. 2 is a block diagram of the present invention.

Referring to FIG. 2 there is illustrated a block diagram of the present invention. An electrical signal 11 derived from an audio source such as a microphone, radio tuner, amplifier, etc. is passed through an amplifier 13 and is then divided into two discrete signal paths 27 and 37. The signal traveling along the first path 37 is passed through a high pass filter circuit 39. The signal is then split. A first portion 37A of the signal 37 passes through a first delay means 40 and then to a first attenuator 42. A second portion 37B of the signal 37 passes though a harmonics generator 60 which is designed to generate harmonics, and then through a second attenuator 62.

One key innovation is the incorporation of the first delay means 40 to delay the first portion 37A of the signal 37 from the high pass filter 39. The effect is that the harmonics generated by the harmonics generator 60 are advanced in time ahead of the input signal portion 37A which passed from the high pass filter 39, so that the harmonics are advanced in time before the first signal portion 37A and second signal portion 37B reach the mixer or summing amplifier 80 where the signals 37A and 37B are combined.

After passing through the amplifier 13, the second signal portion 27 passes through a second delay means 31 and then through a third attenuator 33 before reaching the mixer or summing amplifier 80. Therefore, the effect is that the harmonics generated by the harmonics generator 60 are advanced in time ahead of both the first signal portion 37A and the second signal 27 before all signals reach the mixer or summing amplifier 80 where the signals are combined. The gain of all circuit paths can be adjusted in the summing amplifier 80. The effect is that the harmonics generated by the harmonics generator 60 are advanced in time ahead the input signal 37A passing through high pass filter 39 from path 37 and second signal 27 before reaching the mixer or summing amplifier 80 where the signals are combined. The combined signal is passed through an amplifier 23 and then fed into an output transducer 25 such as a loudspeaker.

Therefore, the use of a delay both on the input signal 27 and the high pass filter output 37A just before the summing amplifier 80 enables the harmonics generated from the generator 60 to be advanced in time ahead of the input signal path 27 and high pass filter signal 37A. As a result, the harmonics are not masked by the lower frequencies, making the effect more apparent and more audible. In addition, the peak level of the transient is increased less because the added harmonics are ahead in time of the transient that generated the harmonics.

Therefore, if the main input signal and the high pass signal are delayed and the generated harmonics are not delayed, there is an increase in the perceived effect of the harmonics. By allowing the harmonics to precede the other signals, they are not masked.

There are additional variations on the invention that could be added such as fixed and or dynamic level adjustments to the high pass signal before and/or after it is split as set forth above and before the combined signals reach the summing amplifier. Also, the harmonics can be amplitude dependent or transient discriminate. The amount of delay in delays 31 and 40 may be equal or unequal. The range of each delay can be from twenty (20) micro-seconds to three (3) milliseconds. The amount of attenuation in 32, 42 and 62 may be equal or unequal. For the high pass filter the attenuation can range from zero (0) to full attenuation. For the harmonic output in the harmonics generator, the attenuation can range from zero to 20 dB.

The above invention is primarily intended for digital audio signals but can be also be used with analog signals.

Of course the present invention is not intended to be restricted to any particular form or arrangement, or any specific embodiment, or any specific use, disclosed herein, since the same may be modified in various particulars or relations without departing from the spirit or scope of the claimed invention hereinabove shown and described of which the apparatus or method shown is intended only for illustration and disclosure of an operative embodiment and not to show all of the various forms or modifications in which this invention might be embodied or operated.

What is claimed is:

1. A method for electronically processing sound from an audio source, comprising:
    a. causing a signal from a sound source to pass through an input amplifier and dividing the signal into two discrete signal paths, a first signal path and a second signal path;
    b. causing a first signal traveling through the first signal path to travel through a high pass filter and then dividing the first signal into two separate filtered signal paths, a first filtered signal path in which the a first filtered signal is delayed by a first delay means and then causing the delayed first filtered signal to pass through a first attenuator, and causing a second filtered signal which travels along a second filtered signal path to travel through a harmonics generators which generates harmonics and then be passed through a second attenuator, then combining the first and second filtered signals in a mixer;
    c. causing a second signal traveling through the second signal path to be delayed by a second delay means and then causing the delayed second signal to pass through a third attenuator and then combining the second delayed signal with the first and second filtered signals in the mixer;
    d. causing the harmonics generated in the harmonics generator to be advanced in time ahead of the delayed first filtered signal and the delayed second signal to make the effect of the harmonics more apparent and audible because the delays cause the harmonics to not be masked by lower frequencies; and
    e. causing the mixed signals to travel from the mixer through an output amplifier and then through an output transducer.

2. The method in accordance with claim 1 wherein the first delay means causes a delay of the first filtered signal in the range of twenty (20) micro-seconds to three (3) milliseconds.

3. The method in accordance with claim 1 wherein the second delay means causes a delay of the second signal in the range of twenty (20) micro-seconds to three (3) milliseconds.

4. The method in accordance with claim 1 wherein the delays caused by the first and second delay means are equal.

5. The method in accordance with claim 1 wherein the delays caused by the first and second delay means are unequal.

6. The method in accordance with claim 1 wherein the attenuation from the first attenuator is in the range of zero to full attenuation.

7. The method in accordance with claim 1 wherein the attenuation from the second attenuator is in the range of zero (0) to 20 dB attenuation.

8. The method in accordance with claim 1 wherein the attenuation from the third attenuator is in the range of zero to full attenuation.

9. The method in accordance with claim 1 wherein the harmonics are amplitude dependent.

10. The method in accordance with claim 1 wherein the harmonics are transient discriminate.

11. The method in accordance with claim 1 wherein the circuit is applied as a multi band circuit with each band having its own set of delays and attenuators.

12. A method for electronically processing sound from an audio source, comprising:
    a. dividing a signal derived from a sound source into first and second signal paths, wherein the first signal path involves delaying the signal, wherein the second signal path involves passing the signal through a high pass filter and then dividing the resultant signal to produce first and second filtered signals, wherein the first filtered signal is delayed in time and the second filtered signal is processed by a harmonics generator which generates harmonics ahead in time of the delayed first filtered signal, and wherein said harmonics are also generated ahead in time of the delayed signal produced by the first signal path;
    b. combining a plurality of signals in a mixer, the plurality of signals including a signal derived from the output of the first signal path, a signal derived from the delayed first filtered signal and a signal derived from the harmonics generated by the harmonics generator, whereby the combining causes the harmonics generated in the harmonics generator to be advanced in time ahead of the delayed first filtered signal and the delayed signal produced by the first signal path in order to make the effect of the harmonics more apparent and audible by reducing the masking of the harmonics by lower frequencies; and
    c. causing the mixed signals to travel to an output transducer.

13. The method in accordance with claim 12 wherein the delay of the first filtered signal is in the range of twenty (20) microseconds to three (3) milliseconds.

14. The method in accordance with claim 12 wherein the delay of the signal in the first signal path is in the range of twenty (20) micro-seconds to three (3) milliseconds.

15. The method in accordance with claim 12 wherein the delay of the first filtered signal and the delay of the signal in the first signal path are equal.

16. The method in accordance with claim 12 wherein the delay of the first filtered signal and the delay of the signal in the first signal path are unequal.

17. A method for electronically processing sound represented by an input signal derived from an audio source, the method comprising:
   a. passing the input signal through a high pass filter and then dividing the resultant signal to produce first and second filtered signals, wherein the first filtered signal is delayed in time and the second filtered signal is processed by an harmonics generator which generates harmonics ahead in time of the delayed first filtered signal;
   b. delaying the input signal without passing the input signal through the high pass filter to produce a delayed third signal, wherein the harmonics generated by the harmonics generator are ahead in time of the delayed third signal; and
   c. combining the delayed first filtered signal, the harmonics generated by the harmonics generator and the delayed third signal, whereby the harmonics are not masked by lower frequencies so that the perceived effect of the harmonics is more apparent and audible.

\* \* \* \* \*